United States Patent
Nygren et al.

(10) Patent No.: US 11,290,000 B2
(45) Date of Patent: Mar. 29, 2022

(54) SWITCH MODULE ASSEMBLY, AND METHOD FOR MANUFACTURING THE SAME

(71) Applicant: ABB Schweiz AG, Baden (CH)

(72) Inventors: Toni Nygren, Helsinki (FI); Asko Mielonen, Helsinki (FI); Hermanni Tervo, Helsinki (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/839,551

(22) Filed: Apr. 3, 2020

(65) Prior Publication Data
US 2020/0321853 A1   Oct. 8, 2020

(30) Foreign Application Priority Data

Apr. 3, 2019 (EP) ..................................... 19166969

(51) Int. Cl.
*H02B 1/04* (2006.01)
*H02M 1/34* (2007.01)
*H02B 1/20* (2006.01)
*H02B 1/24* (2006.01)
*H02M 7/00* (2006.01)

(52) U.S. Cl.
CPC ................ *H02M 1/34* (2013.01); *H02B 1/04* (2013.01); *H02B 1/20* (2013.01); *H02B 1/24* (2013.01); *H02M 7/003* (2013.01); *H02M 1/346* (2021.05)

(58) Field of Classification Search
None
See application file for complete search history.

(56) References Cited

U.S. PATENT DOCUMENTS

| | | | | |
|---|---|---|---|---|
| 5,623,399 A | * | 4/1997 | Ishii | ...................... H05K 7/1432 363/132 |
| 2008/0068775 A1 | * | 3/2008 | Imamura | ................ H01G 2/106 361/301.1 |

(Continued)

FOREIGN PATENT DOCUMENTS

| | | |
|---|---|---|
| DE | 102014101022 B3 | 2/2015 |
| EP | 2418764 A2 | 2/2012 |

(Continued)

OTHER PUBLICATIONS

European Patent Office, Extended Search Report issued in corresponding Application No. 19166969.6, dated Sep. 26, 2019, 5 pp.

*Primary Examiner* — Courtney L Smith
(74) *Attorney, Agent, or Firm* — Leydig, Voit & Mayer, Ltd.

(57) ABSTRACT

A switch module assembly including a switch module including a bus bar system having a positive bus bar and a negative bus bar, and at least one snubber capacitor fastened to the switch module, each of the at least one snubber capacitor having a body part, a positive terminal connected to the positive bus bar, and a negative terminal connected to the negative bus bar. The switch module assembly includes a capacitor support member adapted to reduce vibration of the body part of the at least one snubber capacitor relative to the switch module, the capacitor support member is made of flexible material, and is in contact with the body part of the at least one snubber capacitor and the switch module.

15 Claims, 3 Drawing Sheets

(56) References Cited

U.S. PATENT DOCUMENTS

| | | | | |
|---|---|---|---|---|
| 2011/0038133 A1* | 2/2011 | McNamara | ............ | H05K 3/301 |
| | | | | 361/760 |
| 2013/0140079 A1* | 6/2013 | Nakamura | ............... | H01G 9/12 |
| | | | | 174/551 |
| 2016/0163460 A1* | 6/2016 | Inazumi | ................ | H02M 7/003 |
| | | | | 361/306.1 |
| 2016/0344119 A1* | 11/2016 | Karasik | ................ | H01R 13/719 |
| 2018/0233285 A1* | 8/2018 | Sato | ........................ | H01G 2/10 |
| 2019/0080850 A1* | 3/2019 | Inazumi | .................... | H01G 4/33 |
| 2019/0157967 A1* | 5/2019 | Nishimura | .............. | H05K 7/209 |
| 2019/0172652 A1* | 6/2019 | Biler | .................... | H01G 9/0425 |
| 2019/0202311 A1* | 7/2019 | Yang | .................... | H05K 7/2089 |
| 2020/0118753 A1* | 4/2020 | Nishimura | ............. | H01G 2/106 |

FOREIGN PATENT DOCUMENTS

| | | | |
|---|---|---|---|
| WO | 2012131754 A1 | 10/2012 | |
| WO | 2015064408 A1 | 5/2015 | |

* cited by examiner

SWITCH MODULE ASSEMBLY, AND METHOD FOR MANUFACTURING THE SAME

FIELD OF THE INVENTION

The present invention relates to a switch module assembly.

A known switch module assembly comprises a switch module having a plurality of controllable switches, and snubber capacitors fastened to the switch module.

One of the problems associated with the above known switch module assembly is that during use of the switch module assembly the snubber capacitors vibrate relative to the switch module, thereby causing a risk of breaking terminals of the snubber capacitors.

BRIEF DESCRIPTION OF THE INVENTION

An object of the present invention is to provide a switch module assembly so as to solve the above problem. A further object of the present invention is to provide a method for manufacturing said switch module assembly. The objects of the invention are achieved by a switch module assembly and a method which are characterized by what is stated in the independent claims. The preferred embodiments of the invention are disclosed in the dependent claims.

The invention is based on the idea of providing a switch module assembly with a capacitor support member made of flexible material, and adapted to reduce vibration of the snubber capacitors relative to the switch module. The capacitor support member is at least partially located between the switch module and a body part of each of the snubber capacitors of the assembly, and is in contact with them.

An advantage of the switch module assembly of the invention is that vibration of the snubber capacitor(s) relative to the switch module is reduced.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
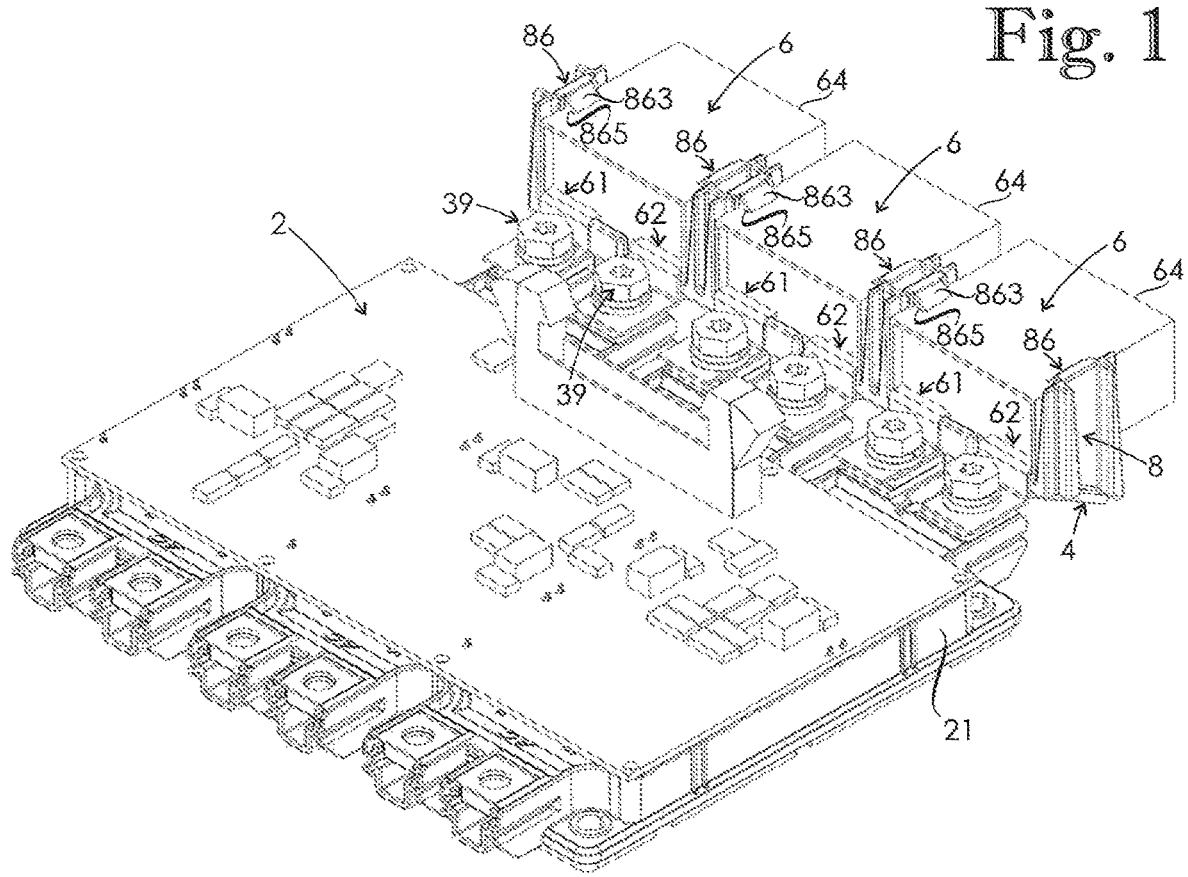
FIG. 1 shows a switch module assembly according to an embodiment of present invention.
Figure 2:
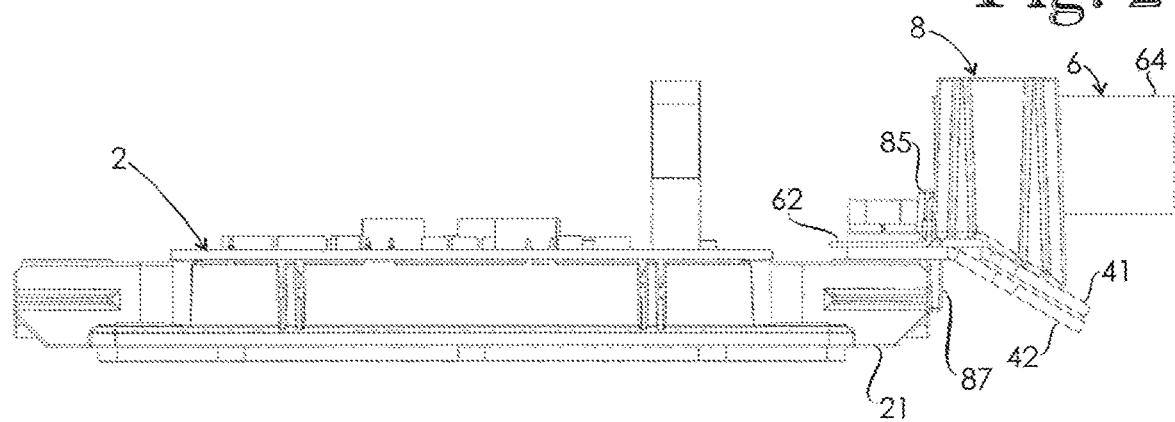
FIG. 2 shows the switch module assembly of FIG. 1 from a different direction.

FIG. 1 shows a switch module assembly comprising a switch module 2, three snubber capacitors 6 fastened to the switch module 2, and a capacitor support member 8. FIG. 2 shows the switch module assembly of FIG. 1 from a different direction.

The switch module 2 comprises a body part 21 and a bus bar system having a positive bus bar 41 and a negative bus bar 42. The positive bus bar 41 is electrically insulated from the negative bus bar 42. The switch module 2 is an IGBT power module having a three phase inverter bridge comprising a plurality of controllable IGBT switches. In an alternative embodiment the switch module has a plurality of controllable switches of another type.

Each of the snubber capacitors 6 has a body part 64, a positive terminal 61 electrically conductively connected to the positive bus bar 41, and a negative terminal 62 electrically conductively connected to the negative bus bar 42. The capacitor support member 8 is made of thermoplastic vulcanizate material (TPV), and is in contact with the switch module 2 and the body part 64 of each of the snubber capacitors 6 for reducing vibration of the body parts 64 of the snubber capacitors 6 relative to the switch module 2. In alternative embodiments, the capacitor support member is made of another thermoplastic elastomer material (TPE), or another suitably flexible material or materials.

Figure 3:
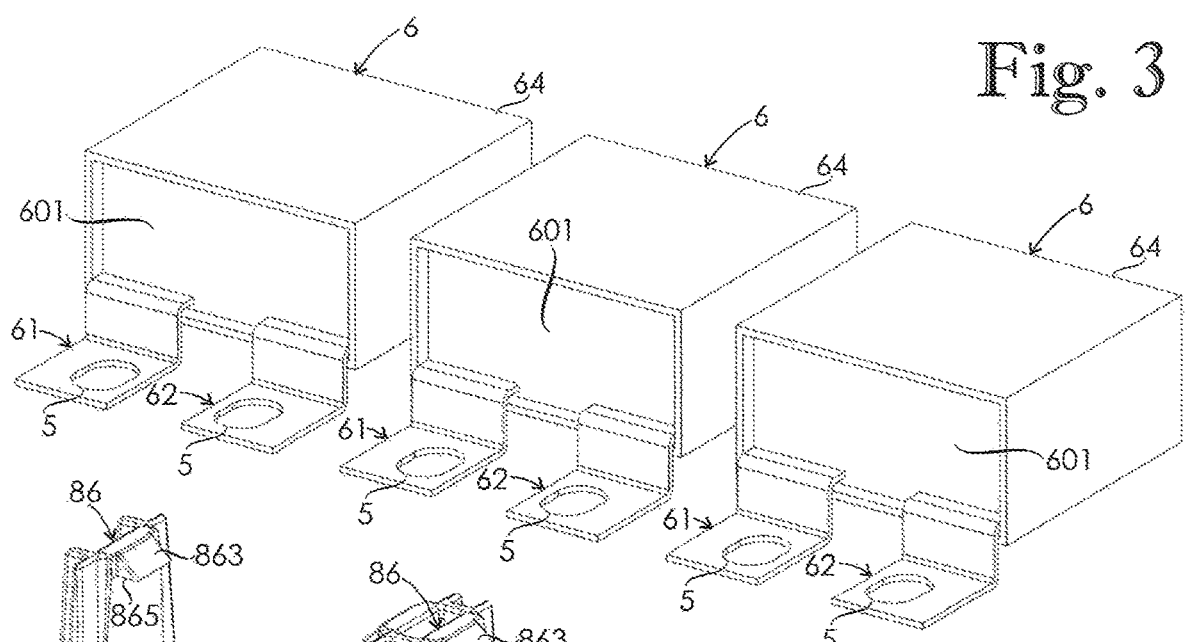
FIG. 3 shows snubber capacitors of the switch module assembly of FIG. 1.

FIG. 3 shows the snubber capacitors 6 as separate components. The body part 64 of each of the snubber capacitors 6 has substantially a shape of rectangular parallelepiped, and has a first end provided with a first surface 601 and a second end provided with a second surface. The first end and the second end are spaced apart in a length direction. The first surface 601 and the second surface are substantially planar surfaces, and substantially parallel with each other.

The positive terminal 61 and the negative terminal 62 protrude from the first surface 601. Cross sections of the positive terminal 61 and the negative terminal 62 of the snubber capacitors 6 are L-shaped such that a first branch extends perpendicular to the length direction, and a second branch extends parallel to the length direction.

Figure 4:
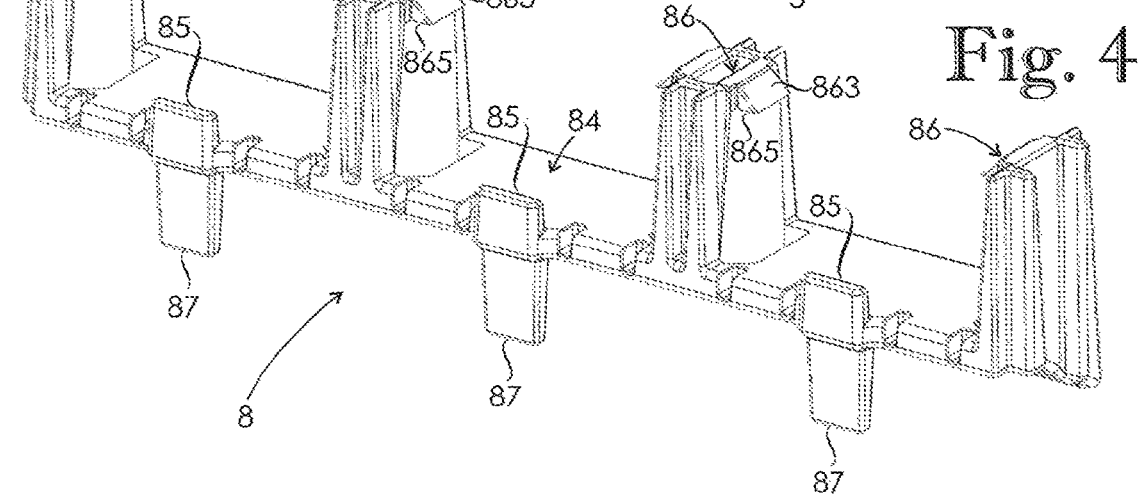
FIG. 4 shows a capacitor support member of the switch module assembly of FIG. 1.
Figure 5:
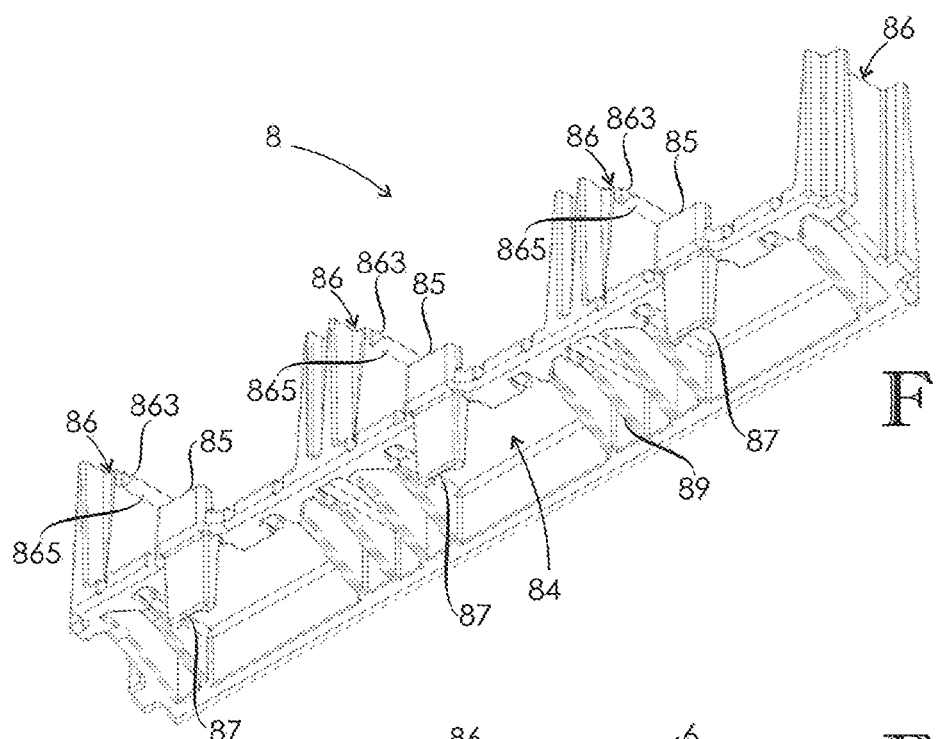
FIG. 5 shows the capacitor support member of FIG. 4 from a different direction.

FIGS. 4 and 5 show the capacitor support member 8 from different directions. The capacitor support member 8 comprises a capacitor positioning system adapted to position the snubber capacitors 6 to a supported position relative to the capacitor support member 8, and a switch module positioning system adapted to position the capacitor support member 8 relative to the switch module 2. In FIG. 1 the snubber capacitors 6 are in the supported position relative to the capacitor support member 8.

In the complete switch module assembly of FIG. 1, a body part 84 of the capacitor support member 8 is in contact with a bottom surface of the body part 64 of each snubber capacitor 6. The bottom surface of the body part 64 is a surface connecting the first surface and the second surface of the body part in the length direction.

The capacitor positioning system is an integral part of the capacitor support member 8, and comprises two snap fit protrusions 86 and a limiting protrusion 85 for each snubber capacitor 6. Each snap fit protrusion 86 protrudes from the body part 84 of the capacitor support member 8, and has a use position adapted to support the snubber capacitor 6 in the supported position, and an installation position adapted to allow moving the snubber capacitor 6 into the supported position relative to the capacitor support member 8. Each snap fit protrusion 86 is adapted to flexibly return to the use position if it is deflected therefrom in the direction of the installation position. Said flexible return to the use position is caused by the flexibility of the material of the capacitor support member 8. In FIGS. 1, 2, 4, 5 and 6 the snap fit protrusions 86 are in their use positions.

Each of the snap fit protrusions 86 has a bevelled surface 863 at a free end thereof. Herein the free end is an end of the snap fit protrusion 86 located at a distance from the body part 84 of the capacitor support member 8. The bevelled surface 863 is adapted to cooperate with the body part 64 of corresponding snubber capacitor 6 for transferring the snap fit protrusion 86 from the use position to the installation position when the snubber capacitor 6 is moved towards the supported position in an installation direction during assembling of the switch module assembly. In FIG. 2 the installation direction is a downwards direction. The cooperation between the body part 64 of the snubber capacitor 6 and the bevelled surface 863 of the snap fit protrusion 86 transfers the bevelled surface 863 in a width direction perpendicular to the installation direction and the length direction.

Each of the snap fit protrusions 86 has a stop surface 865 adapted to cooperate with the body part 64 of corresponding snubber capacitor 6 in the supported position for preventing movement of the snubber capacitor 6 in a direction opposite to the installation direction. FIG. 1 shows that each stop surface 865 is in contact with an upper surface of the body part 64 of corresponding snubber capacitor 6, the upper surface being a surface connecting the first surface and the second surface in the length direction. A normal of the upper surface is perpendicular to both the length direction and the width direction. The upper surface of the body part 64 of the snubber capacitor 6 is parallel with the bottom surface of the body part 64 of the snubber capacitor 6.

In its use position, each snap fit protrusions 86 is adapted to cooperate with the body part 64 of corresponding snubber capacitor 6 in the supported position for preventing movement of the snubber capacitor 6 in a lateral direction parallel to the width direction. There is one snap fit protrusion 86 on both sides of the snubber capacitors 6, so the snap fit protrusions 86 define location of the snubber capacitors 6 relative to the capacitor support member 8 in the width direction.

Each limiting protrusion 85 protrudes from the body part 84 of the capacitor support member 8 and is adapted to cooperate with the first surface 601 of corresponding snubber capacitor 6 for preventing the snubber capacitor 6 from moving from the supported position in a first direction, the first direction being parallel to the length direction.

The first branch of each positive terminal 61 and each negative terminal 62 is adapted to cooperate with the body part 84 of the capacitor support member 8 for preventing the snubber capacitor 6 from moving from the supported position in a second direction opposite to the first direction.

The capacitor positioning system has an open back end such that the capacitor positioning system is not adapted to cooperate with the second surfaces of the snubber capacitors 6. Due to the open back end, the capacitor positioning system is adapted to allow replacing anyone of the snubber capacitors 6 with a snubber capacitor whose body part has a freely selected dimension in the length direction. Further, due to the flexibility of the material of the capacitor support member 8, the capacitor positioning system is adapted to allow replacing anyone of the snubber capacitors 6 with a snubber capacitor whose body part has a width dimension slightly different from the width dimension of the snubber capacitor 6.

The switch module positioning system is an integral part of the capacitor support member 8, and comprises three positioning protrusions 87 protruding from the body part 84 of the capacitor support member 8. Each of the positioning protrusions 87 is adapted to cooperate both with the body part 21 of the switch module 2 and with the bus bar system for positioning the capacitor support member 8 relative to the switch module 2. In alternative embodiments the switch module positioning system is adapted to cooperate either with the body part of the switch module or with the bus bar system for positioning the capacitor support member relative to the switch module.

FIG. 2 shows that the positioning protrusion 87 is in contact with the body part 21 of the switch module 2 for preventing the capacitor support member 8 from moving in the first direction relative to the switch module 2. In FIG. 2 the first direction is a leftwards direction.

Each positioning protrusion 87 protrudes from the body part 84 in an opposite direction compared to the limiting protrusions 85. In FIG. 2 each limiting protrusion 85 protrudes upwards from the body part 84, and each positioning protrusion 87 protrudes downwards from the body part 84.

The positive bus bar 41 has for each snubber capacitor 6 a positive leg 411, and the negative bus bar 42 has for each snubber capacitor 6 a negative leg 421. The positive legs 411 and the negative legs 421 extend in the length direction. The positive legs 411 are electrically conductively connected to each other by a transverse portion 415 of the positive bus bar 41. The negative legs 421 are electrically conductively connected to each other by a transverse portion of the negative bus bar 42. The transverse portion 415 of the positive bus bar 41 and the transverse portion of the negative bus bar 42 extend in the width direction.

A plane defined by the transverse portion 415 of the positive bus bar 41 is at a tilt angle of 30° relative to a plane defined by the positive legs 411. In an alternative embodiment the tilt angle is in a range of 0-60°.

Figure 6:
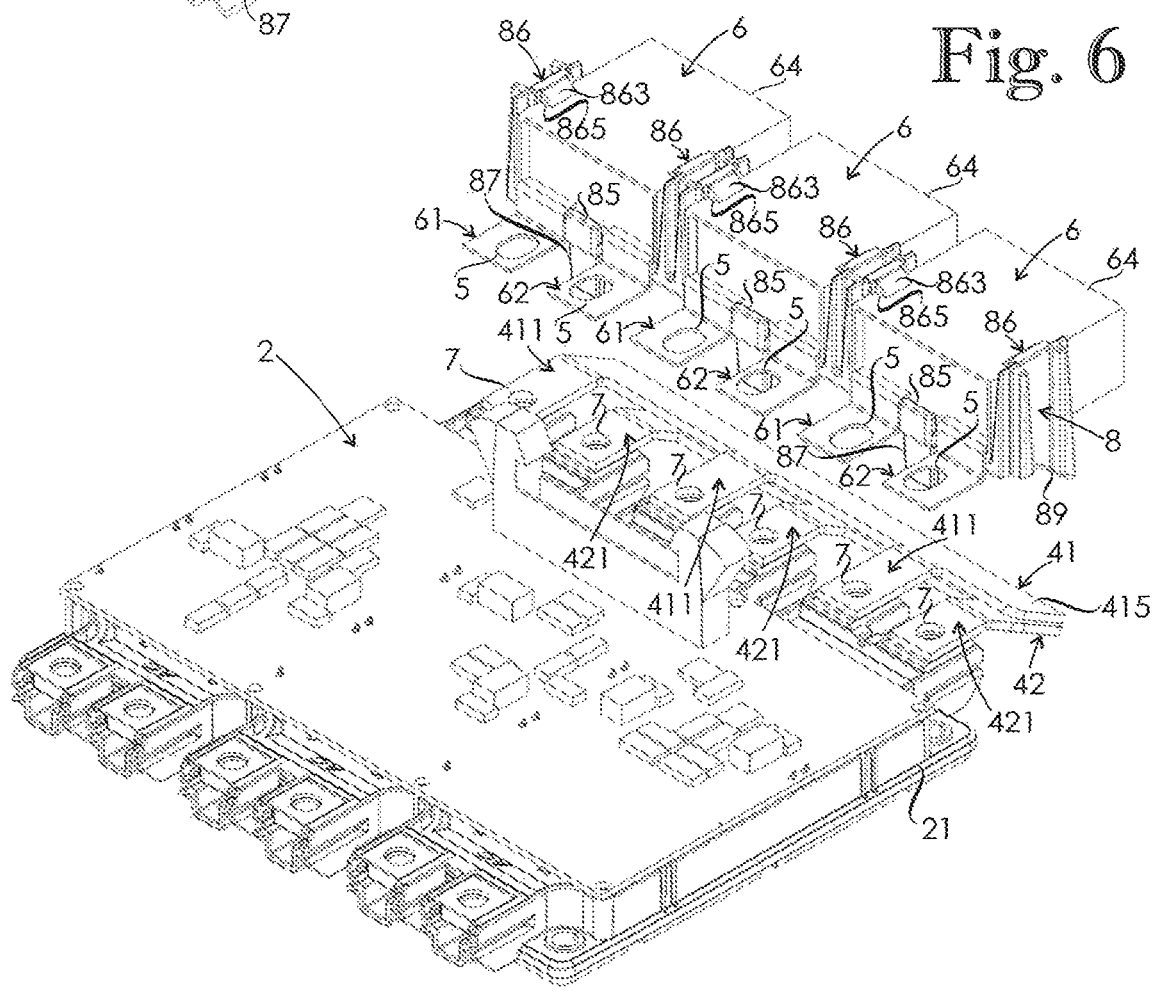
FIG. 6 shows the switch module assembly of FIG. 1 in a partially disassembled state.

In the complete switch module assembly of FIG. 1 each positioning protrusion 87 is located between the positive leg 411 and the negative leg 421 which are electrically conductively connected to the positive terminal 61 and the negative terminal 62 of corresponding snubber capacitor 6, respectively, for positioning the capacitor support member 8 relative to the switch module 2 in the width direction. The positive legs 411 and the negative legs 421 are best seen in FIG. 6, which shows the switch module assembly in a partially disassembled state.

The positive terminal 61 of each snubber capacitor 6 is provided with a terminal aperture 5, and the negative terminal 62 of each snubber capacitor 6 is provided with a terminal aperture 5. Each of the terminal apertures 5 is located in the second branch of corresponding terminal. A cross section of each of the terminal apertures 5 has a shape of an ellipse.

Each positive leg 411 of the positive bus bar 41 is provided with a leg aperture 7, and each negative leg 421 of the negative bus bar 42 is provided with a leg aperture 7. A cross section of each of the leg apertures 7 has a shape of a circle.

Each snubber capacitor 6 is fastened to the switch module 2 by a screw connection. The switch module assembly comprises for each snubber capacitor 6 two screws 39, and two screw holes provided in the body part 21 of the switch module 2. Each of the screw holes is a threaded hole. A threaded portion of each screw 39 cooperates with a corresponding screw hole of the body part 21 of the switch module 2. A shank of each screw 39 passes through corresponding terminal aperture 5 and leg aperture 7.

The capacitor support member 8 comprises a bus bar engagement portion 89 that is in contact with the bus bar system. The bus bar engagement portion 89 is best seen in FIG. 5. In the embodiment of FIG. 1, majority of a contact surface between the bus bar engagement portion 89 and the bus bar system is between the bus bar engagement portion 89 and the transverse portion 415 of the positive bus bar 41. In alternative embodiments, the bus bar engagement portion is adapted to cooperate with one or more of the following: the transverse portion of the positive bus bar, the transverse portion of the negative bus, at least one positive leg of the positive bus bar, and at least one negative leg of the negative bus bar.

A method for manufacturing the switch module assembly of FIG. 1 comprises providing the switch module 2, the snubber capacitors 6 and the capacitor support member 8. A snubber capacitor subassembly is formed by receiving the snubber capacitors 6 in the capacitor support member 8 before the capacitor support member 8 is connected to the switch module 2. The middle one of the snubber capacitors 6 is received first in the capacitor support member 8. Since the capacitor support member 8 is not yet connected to the switch module 2, it is possible to bend the capacitor support member 8 around a line parallel to the length direction in order to facilitate receiving of the snubber capacitors 6.

It will be obvious to a person skilled in the art that the inventive concept can be implemented in various ways. The invention and its embodiments are not limited to the examples described above but may vary within the scope of the claims.

The invention claimed is:

1. A switch module assembly comprising:
   a switch module having a plurality of controllable switches, the switch module comprising a body part and a bus bar system having a positive bus bar and a negative bus bar; and
   at least one snubber capacitor fastened to the switch module, each of the at least one snubber capacitor having a body part, a positive terminal connected to the positive bus bar, and a negative terminal connected to the negative bus bar;
   wherein the switch module assembly comprises a capacitor support member adapted to reduce vibration of the body part of the at least one snubber capacitor relative to the switch module, the capacitor support member is made of flexible material, has a body part, and is in contact with the body part of the at least one snubber capacitor and the switch module;
   wherein the capacitor support member comprises a capacitor positioning system adapted to position the at least one snubber capacitor to a supported position relative to the capacitor support member, the capacitor positioning system being an integral part of the capacitor support member, and comprising at least one snap fit protrusion for each of the at least one snubber capacitor, each of the at least one snap fit protrusion protrudes from the body part of the capacitor support member, and has a use position adapted to support the snubber capacitor in the supported position, and an installation position adapted to allow moving the snubber capacitor into the supported position relative to the capacitor support member, each of the at least one snap fit protrusion being adapted to flexibly return to the use position if it is deflected therefrom in the direction of the installation position.

2. The switch module assembly as claimed in claim 1, wherein each of the atleast one snap fit protrusion has a bevelled surface at a free end thereof, the bevelled surface being adapted to cooperate with the body part of corresponding snubber capacitor for transferring the snap fit protrusion from the use position to the installation position when the snubber capacitor is moved towards the supported position in an installation direction.

3. The switch module assembly as claimed in claim 2, wherein each of the at least one snap fit protrusion has a stop surface adapted to cooperate with the body part of corresponding snubber capacitor in the supported position for preventing movement of the snubber capacitor in a direction opposite to the installation direction.

4. The switch module assembly as claimed in claim 1, wherein the body part of each of the at least one snubber capacitor has a first end provided with a first surface and a second end provided with a second surface, the first end and the second end being spaced apart in a length direction, the positive terminal and the negative terminal protrude from the first surface, and the capacitor positioning system comprises a limiting protrusion for each of the at least one snubber capacitor, each of the limiting protrusion protrudes from the body part of the capacitor support member and is adapted to cooperate with the first surface of corresponding snubber capacitor for preventing the snubber capacitor from moving from the supported position in a first direction, the first direction being parallel to the length direction.

5. The switch module assembly as claimed in claim 4, wherein the capacitor positioning system has an open back end such that the capacitor positioning system is not adapted to cooperate with the second surface of the at least one snubber capacitor, wherein the capacitor positioning system is adapted to allow replacing anyone of the at least one snubber capacitor with a snubber capacitor whose body part has a freely selected dimension in the length direction.

6. The switch module assembly as claimed in claim 4, wherein cross sections of the positive terminal and the negative terminal of each of the at least one snubber capacitor are L-shaped such that a first branch extends perpendicular to the length direction, and a second branch extends parallel to the length direction, wherein the first branch is adapted to cooperate with the body part of the capacitor support member for preventing the snubber capacitor from moving from the supported position in a second direction opposite to the first direction.

7. The switch module assembly as claimed in claim 1, wherein the capacitor support member comprises a switch module positioning system adapted to position the capacitor support member relative to the switch module, the switch module positioning system being an integral part of the capacitor support member, and comprising at least one positioning protrusion protruding from the body part of the capacitor support member, the at least one positioning protrusion being adapted to cooperate with the switch module for positioning the capacitor support member relative to the switch module.

8. A switch module assembly comprising:
   a switch module having a plurality of controllable switches, the switch module comprising a body part and a bus bar system having a positive bus bar and a negative bus bar; and
   at least one snubber capacitor fastened to the switch module, each of the at least one snubber capacitor having a body part, a positive terminal connected to the positive bus bar, and a negative terminal connected to the negative bus bar;
   wherein the switch module assembly comprises a capacitor support member adapted to reduce vibration of the body part of the at least one snubber capacitor relative to the switch module, the capacitor support member is made of flexible material, has a body part, and is in contact with the body part of the at least one snubber capacitor and the switch module;
   wherein the capacitor support member comprises a switch module positioning system adapted to position the capacitor support member relative to the switch module, the switch module positioning system being an integral part of the capacitor support member, and comprising at least one positioning protrusion protruding from the body part of the capacitor support member, the at least one positioning protrusion being adapted to cooperate with the switch module for positioning the capacitor support member relative to the switch module; and wherein the switch module positioning system is adapted to cooperate with the bus bar system for positioning the capacitor support member relative to the switch module.

9. The switch module assembly as claimed in claim 8, wherein the bus bar system has for each of the at least one snubber capacitor a positive leg and a negative leg, and for each of the at least one snubber capacitor, one of the at least one positioning protrusion is located between the positive leg and the negative leg for positioning the capacitor support member relative to the switch module.

10. The switch module assembly as claimed in claim 4, wherein the capacitor support member comprises a bus bar engagement portion that is in contact with the positive bus bar and/or the negative bus bar.

11. The switch module assembly as claimed in claim 1, wherein the switch module assembly comprises three snubber capacitors.

12. The switch module assembly as claimed in claim 1, wherein the capacitor support member is made of thermoplastic elastomer material.

13. The switch module assembly as claimed in claim 1, wherein the capacitor support member is an injection moulded member.

14. A method for manufacturing the switch module assembly as claimed in claim 1, the method comprising:
    providing the switch module;
    providing the at least one snubber capacitor;
    providing the capacitor support member;
    forming a snubber capacitor subassembly by receiving the at least one snubber capacitor in the capacitor support member; and
    fastening the snubber capacitor subassembly to the switch module.

15. A method for manufacturing the switch module assembly as claimed in claim 8, the method comprising:
    providing the switch module;
    providing the at least one snubber capacitor;
    providing the capacitor support member;
    forming a snubber capacitor subassembly by receiving the at least one snubber capacitor in the capacitor support member; and
    fastening the snubber capacitor subassembly to the switch module.

* * * * *